US012401336B2

(12) United States Patent
Clay

(10) Patent No.: US 12,401,336 B2
(45) Date of Patent: Aug. 26, 2025

(54) AUDIO INTERFACE

(71) Applicant: Audoo Limited, London (GB)

(72) Inventor: Oliver James Clay, Llanelli (GB)

(73) Assignee: Audoo Limited, London (GB)

( * ) Notice: Subject to any disclaimer, the term of this patent is extended or adjusted under 35 U.S.C. 154(b) by 197 days.

(21) Appl. No.: 18/551,260

(22) PCT Filed: Mar. 24, 2022

(86) PCT No.: PCT/GB2022/050736
§ 371 (c)(1),
(2) Date: Sep. 19, 2023

(87) PCT Pub. No.: WO2022/200794
PCT Pub. Date: Sep. 29, 2022

(65) Prior Publication Data
US 2024/0178810 A1    May 30, 2024

(30) Foreign Application Priority Data

Mar. 26, 2021  (GB) ..................... 2104341

(51) Int. Cl.
*H03G 3/30*   (2006.01)
*H03G 7/00*   (2006.01)
*H03G 11/00*  (2006.01)

(52) U.S. Cl.
CPC .......... *H03G 3/3005* (2013.01); *H03G 7/002* (2013.01); *H03G 7/007* (2013.01); *H03G 11/002* (2013.01)

(58) Field of Classification Search
CPC ...... H03G 3/3005; H03G 7/002; H03G 7/007; H03G 11/002; H03G 7/005; H03G 1/00;

(Continued)

(56) References Cited

U.S. PATENT DOCUMENTS 6,088,461 A * 7/2000 Lin ................. H03G 3/001
                                         381/104
6,882,735 B2 * 4/2005 Staley .............. H03G 7/007
                                         381/106

(Continued)

FOREIGN PATENT DOCUMENTS

GB      2 429 346 A    2/2007

OTHER PUBLICATIONS

International Search Report and Written Opinion dated Sep. 29, 2022 in Application No. PCT/GB2022/050736 in 9 pages.

*Primary Examiner* — Xu Mei
(74) *Attorney, Agent, or Firm* — Knobbe Martens Olson & Bear, LLP

(57) ABSTRACT

An audio interface system is disclosed that receives an audio signal from an audio line and outputs a normalised audio signal. An audio interface device of the audio interface system comprises a signal conditioning module, a gain module to apply a gain to the audio signal and an attenuation module to apply an attenuation to the audio signal to output the normalised audio signal. The audio interface device further comprises an interface configured to communicate the normalised signal to an external device. In response to determining that an amplitude of the audio signal does not meet a minimum amplitude requirement or exceed a maximum amplitude requirement, the signal conditioning module is to adjust the amplitude of the audio signal by applying the gain and/or attenuation to meet the requirement.

18 Claims, 9 Drawing Sheets

(58) Field of Classification Search
CPC ........... H03F 2203/45522; H03F 3/183; H03F 3/45475; H04H 60/04; G06F 3/167; G06F 3/16
USPC ............... 381/102, 104, 106, 107, 109, 119; 715/716, 727
See application file for complete search history.

(56) References Cited

U.S. PATENT DOCUMENTS

| | | | |
|---|---|---|---|
| 7,013,011 B1* | 3/2006 | Weeks | H03G 9/025 |
| | | | 381/98 |
| 8,225,207 B1* | 7/2012 | Ramirez | G10H 1/0091 |
| | | | 715/204 |
| 8,538,042 B2* | 9/2013 | Yang | H03G 5/165 |
| | | | 381/103 |
| 9,706,302 B2* | 7/2017 | Hansen | H04R 3/04 |
| 10,461,712 B1 | 10/2019 | Yang et al. | |
| 10,466,959 B1 | 11/2019 | Yang et al. | |
| 2002/0126860 A1 | 9/2002 | Staley | |
| 2004/0101145 A1* | 5/2004 | Falcon | H04S 7/00 |
| | | | 381/64 |
| 2008/0269926 A1 | 10/2008 | Xiang et al. | |
| 2009/0287496 A1* | 11/2009 | Thyssen | H03G 7/007 |
| | | | 704/500 |
| 2017/0048615 A1* | 2/2017 | Son | H03G 5/165 |
| 2018/0269842 A1* | 9/2018 | Cohrs | H03G 3/3005 |

\* cited by examiner

AUDIO INTERFACE

BACKGROUND

Field

The present application relates to audio interfaces, and more specifically audio interface devices configured to automatically normalize an audio signal.

Description of the Related Art

Traditionally, inputting an audio feed to a computer from an audio source requires the use of different adapters depending on the voltage of the audio that is being input. For example, a microphone has a very small signal, a 'line-out' is typically, 2-10 VRMS, whereas speaker output connections can range up to 120 VRMS for 70/100 V constant voltage speaker networks. That is, to connect different audio sources to a computer requires the use of different adapters. Sound cards and audio input devices are typically designed to be the endpoint of a signal, and therefore have a fixed impedance that allows for good signal transfer. Connecting multiple inputs to one output can cause amplitude changes on the line if the driver does not have enough power to cope with multiple drains.

SUMMARY

In a first aspect, there is provided an audio interface system configured to receive an audio signal from an audio line and output a normalized audio signal, wherein the audio interface system comprises an audio interface device comprising: a signal conditioning module comprising a gain module configured to apply a gain to the audio signal and an attenuation module configured to apply an attenuation to the audio signal to output the normalized audio signal, and an interface configured to communicate the normalized signal with an external device, wherein, in response to the audio interface system determining that an amplitude of the audio signal does not meet a minimum amplitude requirement or exceeds a maximum amplitude requirement, the signal conditioning module is configured to adjust the amplitude of the audio signal by applying the gain and/or attenuation to output the normalized audio signal having an amplitude that meets the minimum amplitude requirement and does not exceed the maximum amplitude requirement.

In this way, audio signals can be received over a range of voltages, and these voltages can be normalized so that a single audio interface device can be used for audio lines corresponding to an array of different types of device. As such, the system provides a 'one size fits all' approach to monitoring audio signals, and the need for different adapters for different audio sources or different points in an audio line is obviated.

In an example, the signal conditioning module is configured to reduce the attenuation applied by the attenuation module, increase the gain applied by the gain module, or turn off a current limiter, when a sample of the audio signal does not meet the minimum amplitude requirement.

In this way, the system can adjust the parameters at the signal conditioning module such that a higher quality audio signal from a low volume/low voltage source can be achieved by normalizing the received signal to increase the amplitude.

In an example, the audio interface system is configured to determine that the amplitude does not meet the minimum amplitude requirement when the amplitude of the audio signal in the sample is below a first threshold.

In an example, the first threshold is a minimum allowable peak amplitude value of the audio signal in the sample. Alternatively, the first threshold is a minimum allowable RMS (root mean square) value of the audio signal in the sample.

In an example, the signal conditioning module is configured to reduce the attenuation applied by the attenuation module repeatedly by predetermined amounts until a further sample of the audio signal meets the minimum amplitude requirement, or until the attenuation is reduced to a minimum.

In this way, the attenuation is incrementally decreased until either an output audio signal of suitable quality is achieved, or the attenuation level reaches a minimum (e.g., when the attenuator is switched off). This incremental decrease allows for the attenuation to be gradually reduced, without reducing it so much that the amplitude of the signal become too high.

In an example, the signal conditioning module is configured to increase the gain applied by the gain module repeatedly by predetermined amounts until a further sample of the audio signal meets the minimum amplitude requirement.

In this way, the gain is incrementally increased until an output audio signal of suitable quality is achieved. This incremental increase allows for the gain to be gradually increased, without increasing it so much that the amplitude of the signal become too high.

In an example, the signal conditioning module is configured to only increase the gain applied by the gain module when the attenuation applied by the attenuation module is at a minimum and a sample of the audio signal does not meet the minimum amplitude requirement.

In this way, the gain is only applied after the attenuation is set to a minimum. This prevents the gain module and the attenuation module competing with one another, thereby saving power, because the gain is not being applied at a higher level to overcome attenuation that is also be applied.

In an example, the signal conditioning module is configured to decrease the gain applied by the gain module, or increase the attenuation applied by the attenuation module, when a sample of the audio signal exceeds the maximum amplitude requirement.

In this way, the system can adjust the parameters at the signal conditioning module such that a higher quality audio signal from a high volume/high voltage source can be achieved by normalizing the received signal to reduce the amplitude.

In an example, the audio interface system is configured to determine that the amplitude exceeds the maximum amplitude requirement when the amplitude of the audio signal in the sample meets or exceeds a second threshold.

In an example, the second threshold is a maximum allowable peak amplitude value of the audio signal in the sample, at or above which the audio signal clips. The second threshold may be met/exceeded when a single peak of the audio signal in the sample clips; alternatively, the second threshold may be met/exceeded when a predetermined number (greater than one) of peaks of the audio signal in the sample clip.

In an example, the value of second threshold is greater than the value of the first threshold.

In an example, the signal conditioning module is configured to decrease the gain applied by the gain module repeatedly by predetermined amounts until a further sample of the audio signal does not exceed the maximum amplitude requirement, or until the gain is decreased to a minimum.

In this way, the gain is incrementally decreased until either an output audio signal of suitable quality is achieved, or the gain level reaches a minimum (e.g., when the gain module/amplifier is switched off). This incremental decrease allows for the gain to be gradually reduced, without reducing it so much that the amplitude of the signal becomes too low.

In an example, the signal conditioning module is configured to increase the attenuation applied by the attenuation module repeatedly by predetermined amounts until a further sample of the audio signal does not exceed the maximum amplitude requirement.

In this way, the attenuation is incrementally increased until an output audio signal of suitable quality is achieved. This incremental increase allows for the attenuation to be gradually increased, without increasing it so much that the amplitude of the signal become too low.

In an example, the signal conditioning module is configured to only increase the attenuation applied by the attenuation module when the gain applied by the gain module is at a minimum and a sample of the audio signal exceeds the maximum amplitude requirement.

In this way, the attenuation is only applied after the gain is set to a minimum. This prevents the attenuation module and the gain module competing with one another, thereby saving power, because the attenuation is not being applied at a higher level to overcome gain that is also being applied.

In an example, the signal conditioning module is configured to enter a safe setting upon a powering on or resetting of the audio interface device, wherein in the safe setting the signal conditioning module is configured to set the attenuation applied by the attenuation module to a maximum and setting the gain applied by the gain module to a minimum.

When an interface device is connected to a high voltage audio source there is a risk of damage to components due to the high voltage of the received audio signal. By setting the attenuation applied by the attenuation module to a maximum and setting the gain applied by the gain module to a minimum, the audio interface device and the external device are protected from high voltages before the connection is made, rather than determining that the high voltage source might cause damage after it has already been connected.

In an example, in the safe setting the signal conditioning module is further configured to switch on a current limiter.

In an example, the audio interface device comprises a digitizing module configured to convert the normalized audio signal to a digital audio signal.

In this way, the digital signal can be processed by the external device without the external device needing to convert an analogue signal to a digital signal, thereby minimizing requirements placed upon the external device.

In an example, the digitizing module is an audio digitizer, for example integrated in a sounds card, or an analogue-to-digital converter.

In an example, the audio interface device comprises a digital optical isolator configured to receive the digital audio signal from the digitizing module and to isolate the digital audio signal to provide an isolation between an analogue side of the audio interface device and a digital side of the audio interface device.

In this way, optical isolation can be used to isolate the audio signal, thereby improving the quality of the output signal.

In an example, the audio interface device comprises an audio transformer configured to electrically isolate the audio signal or the normalized audio signal.

In this way, magnetic isolation can be used to isolate the audio signal either before or after normalization, thereby improving the quality of the output signal.

In an example, the audio transformer is arranged before the signal conditioning module to electrically isolate the audio signal. Alternatively, the audio transformer is arranged after the signal conditioning module to electrically isolate the normalized audio signal.

In an example, the audio interface device is configured to receive the audio signal from a wiretap in the audio line.

In this way, the audio interface device can connect to the audio line of any commonly available audio system in a way that does not affect the current connection of the audio system.

In an example, the audio interface device comprises a data port configured to connect to the digital interface of a second audio interface device to daisy-chain the audio interface device and the second audio interface device.

In this way, multiple audio lines can be monitored in a single system without complex connection arrangements.

In an example, the audio interface system comprises a plurality of audio interface devices daisy-chained by their respective data ports.

In this way, an external device can monitor multiple audio lines whilst only using one data port (e.g., a USB port) rather than occupying a data port for each audio interface device. This allows for multiple audio lines to be monitored at a single external device.

In an example, the system further comprises the external device.

In an example, the received audio signal is an analogue audio signal.

In an example, the interface is a digital interface.

In a second aspect, there is provided an audio signal normalization method, the method comprising: receiving, at an audio interface system comprising an audio interface device, an audio signal from an audio line; determining that an amplitude of the audio signal does not meet a minimum amplitude requirement or exceeds a maximum amplitude requirement; normalizing, by a signal conditioning module of the audio interface device, the audio signal by adjusting the amplitude of the audio signal by applying gain to the audio signal by a gain module of the signal conditioning module, and/or by applying attenuation to the audio signal by an attenuation module of the signal conditioning module, to output a normalized audio signal having an amplitude that meets the minimum amplitude requirement and does not exceed the maximum amplitude requirement; and communicating, by an interface of the audio interface device, the normalized audio signal with an external device.

In this way, audio signals can be received over a range of voltages, and these voltages can be normalized so that a single audio interface device can be used for audio lines corresponding to an array of different types of device. As such, the system provides a 'one size fits all' approach to monitoring audio signals, and the need for different adapters for different audio sources or different points in an audio line is obviated.

In an example, determining that the amplitude does not meet the minimum amplitude requirement comprises determining that the amplitude of the audio signal in a sample of the audio signal is below a first threshold.

In an example, the first threshold is a minimum allowable peak amplitude value of the audio signal in the sample. Alternatively, the first threshold is a minimum allowable RMS (root mean square) value of the audio signal in the sample.

In an example, determining that the amplitude does not meet the minimum amplitude requirement comprises determining that the amplitude of the audio signal in a sample of the audio signal meets or exceeds a second threshold.

In an example, the second threshold is a maximum allowable peak amplitude value of the audio signal in the sample, at or above which the audio signal clips. The second threshold may be met/exceeded when a single peak of the audio signal in the sample clips; alternatively, the second threshold may be met/exceeded when a predetermined number (greater than one) of peaks of the audio signal in the sample clip.

In an example, the value of second threshold is greater than the value of the first threshold.

In an example, normalizing the audio signal comprises: determining a sample of the audio signal does not meet a minimum amplitude requirement; and reducing the attenuation applied by the attenuation module; increasing the gain applied by the gain module; or turning off a current limiter of the signal conditioning module.

In this way, the system can adjust the parameters at the signal conditioning module such that a higher quality audio signal from a low volume/low voltage source can be achieved by normalizing the received signal to increase the amplitude.

In an example, reducing the attenuation applied by the attenuation module comprises reducing the attenuation repeatedly by predetermined amounts until a further sample of the audio signal meets the minimum amplitude requirement, or until the attenuation is reduced to a minimum.

In this way, the attenuation is incrementally decreased until either an output audio signal of suitable quality is achieved, or the attenuation level reaches a minimum (e.g., when the attenuator is switched off). This incremental decrease allows for the attenuation to be gradually reduced, without reducing it so much that the amplitude of the signal become too high.

In an example, increasing the gain applied by the gain module comprises increasing the gain repeatedly by predetermined amounts until a further sample of the audio signal meets the minimum amplitude requirement.

In this way, the gain is incrementally increased until an output audio signal of suitable quality is achieved. This incremental increase allows for the gain to be gradually increased, without increasing it so much that the amplitude of the signal become too high.

In an example, normalizing the audio signal further comprises only increasing the gain applied by the gain module when the attenuation applied by the attenuation module is at a minimum and a sample of the audio signal does not meet the minimum amplitude requirement.

In this way, the gain is only applied after the attenuation is set to a minimum. This prevents the gain module and the attenuation module competing with one another, thereby saving power, because the gain is not being applied at a higher level to overcome attenuation that is also be applied.

In an example, normalizing the audio signal comprises: determining a sample of the audio signal exceeds a maximum amplitude requirement; and decreasing the gain applied by the gain module; or increasing the attenuation applied by the attenuation module.

In this way, the system can adjust the parameters at the signal conditioning module such that a higher quality audio signal from a high volume/high voltage source can be achieved by normalizing the received signal to reduce the amplitude.

In an example, decreasing the gain applied by the gain module comprises decreasing the gain repeatedly by predetermined amounts until a further sample of the audio signal does not exceed the maximum amplitude requirement, or until the gain is decreased to a minimum.

In this way, the gain is incrementally decreased until either an output audio signal of suitable quality is achieved, or the gain level reaches a minimum (e.g., when the gain module/amplifier is switched off). This incremental decrease allows for the gain to be gradually reduced, without reducing it so much that the amplitude of the signal becomes too low.

In an example, increasing the attenuation applied by the attenuation module comprises increasing the attenuation repeatedly by predetermined amounts until a further sample of the audio signal does not exceed the maximum amplitude requirement.

In this way, the attenuation is incrementally increased until an output audio signal of suitable quality is achieved. This incremental increase allows for the attenuation to be gradually increased, without increasing it so much that the amplitude of the signal become too low.

In an example, normalizing the audio signal further comprises only increasing the attenuation applied by the attenuation module when the gain applied by the gain module is at a minimum and a sample of the audio signal exceeds the maximum amplitude requirement.

In this way, the attenuation is only applied after the gain is set to a minimum. This prevents the attenuation module and the gain module competing with one another, thereby saving power, because the attenuation is not being applied at a higher level to overcome gain that is also being applied.

In an example, the method further comprises: entering a safe setting in response to determining that the audio device has been powered on or reset, wherein entering the safe setting comprises setting the attenuation applied by the attenuation module to a maximum and setting the gain applied by the gain module to a minimum.

When an interface device is connected to a high voltage audio source there is a risk of damage to components due to the high voltage of the received audio signal. By setting the attenuation applied by the attenuation module to a maximum and setting the gain applied by the gain module to a minimum, the audio interface device and the external device are protected from high voltages before the connection is made, rather than determining that the high voltage source might cause damage after it has already been connected.

In a third aspect, there is provided one or more non-transitory computer-readable media storing instructions that, when executed by one or more processors in an audio interface system, cause the one or more processors to perform the method of the second aspect.

BRIEF DESCRIPTION OF THE DRAWINGS

Embodiments of the disclosure are now described, by way of example, with reference to the drawings, in which.

DETAILED DESCRIPTION

Figure 1A:
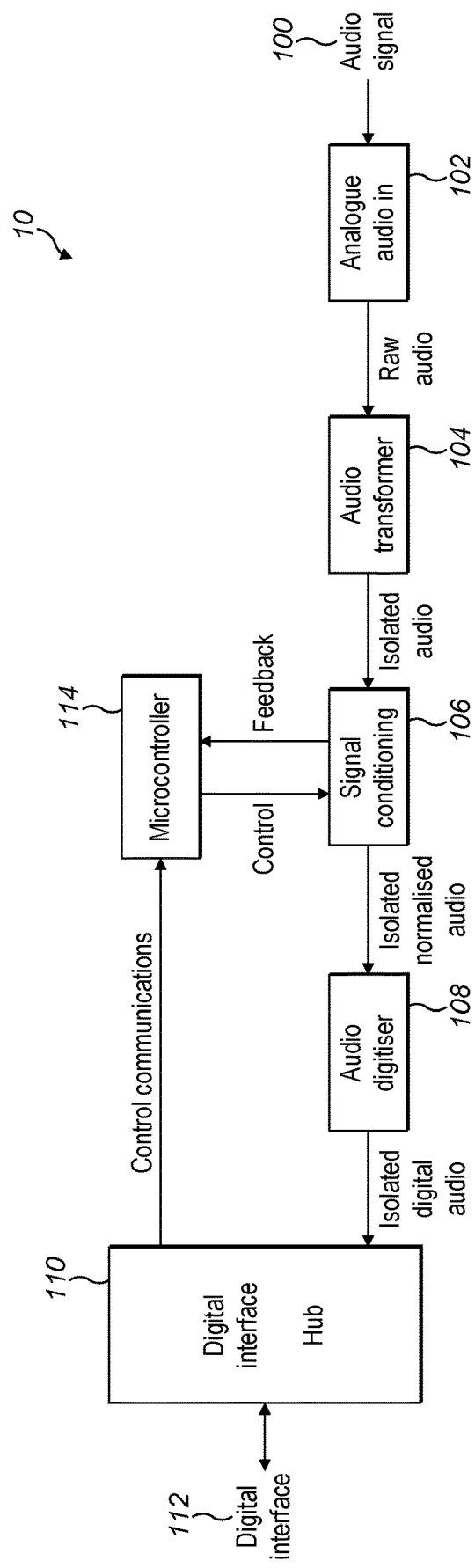
FIG. 1A is a conceptual diagram of an audio interface device.
Figure 1B:
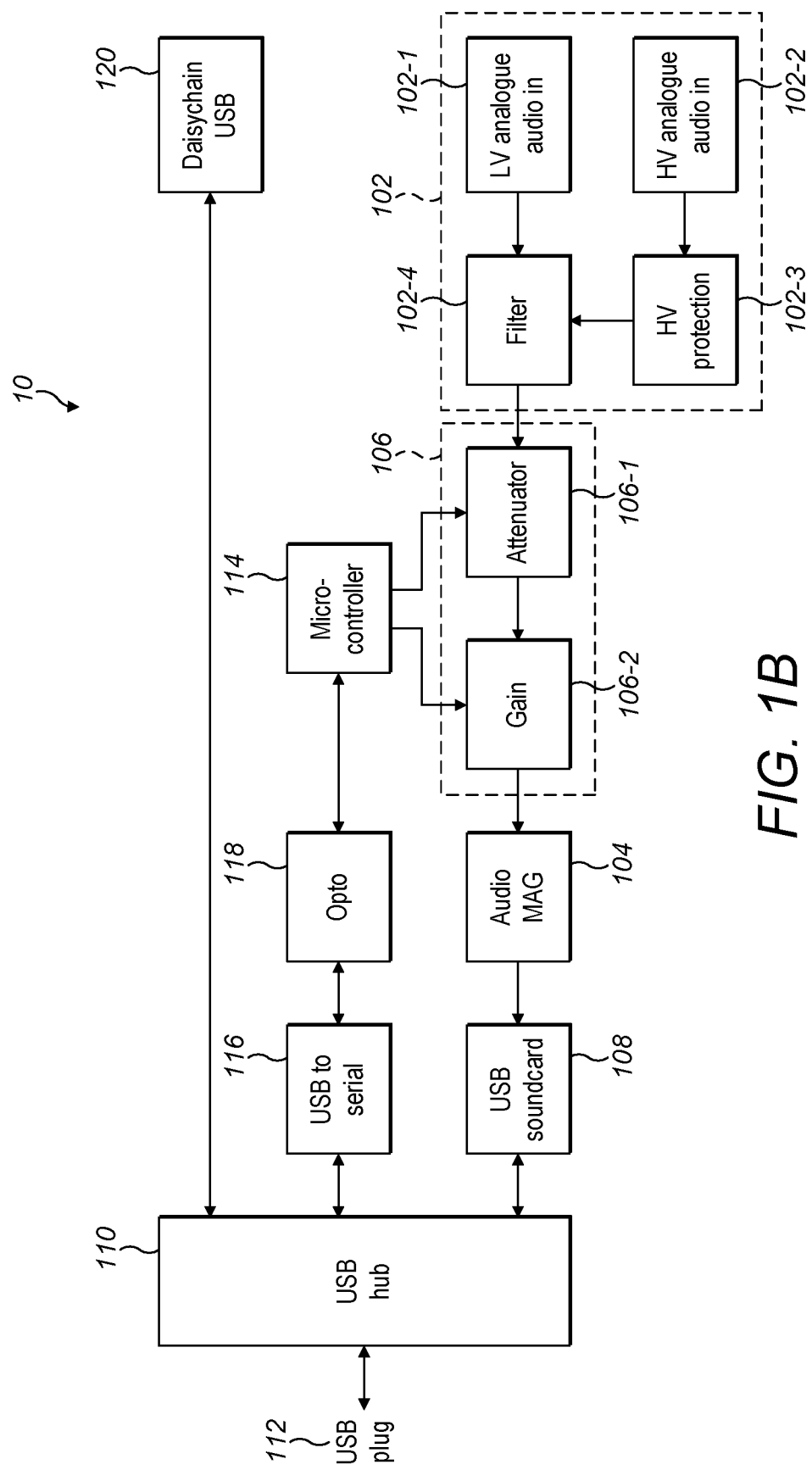
FIG. 1B is a block diagram of the audio interface device of FIG. 1A.
Figure 2A:
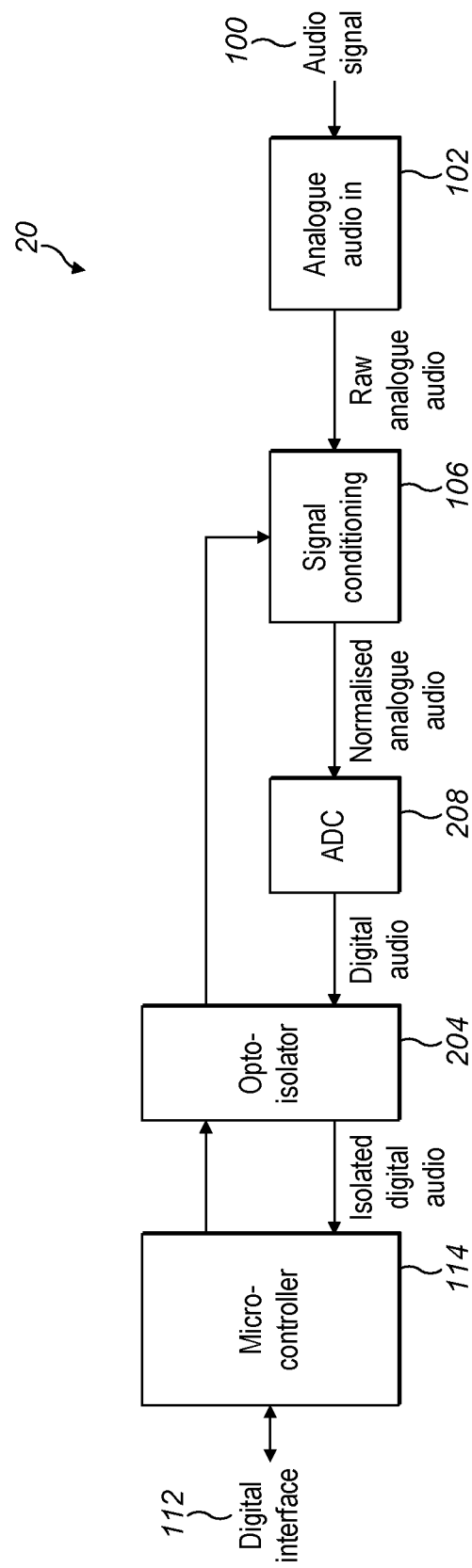
FIG. 2A is a conceptual diagram of another audio interface device.
Figure 2B:
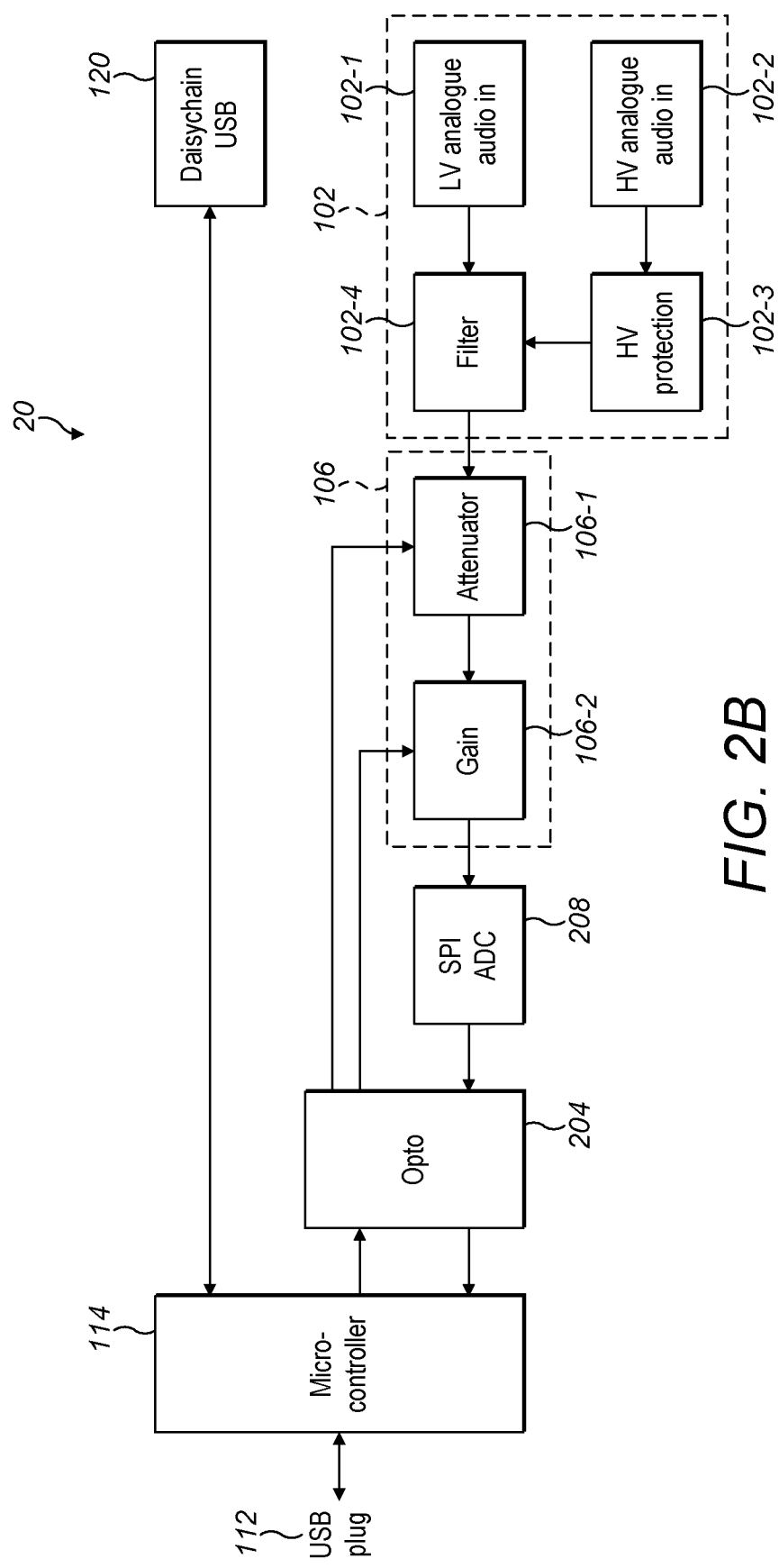
FIG. 2B is a block diagram of the audio interface device of FIG. 2A.
Figure 2C:
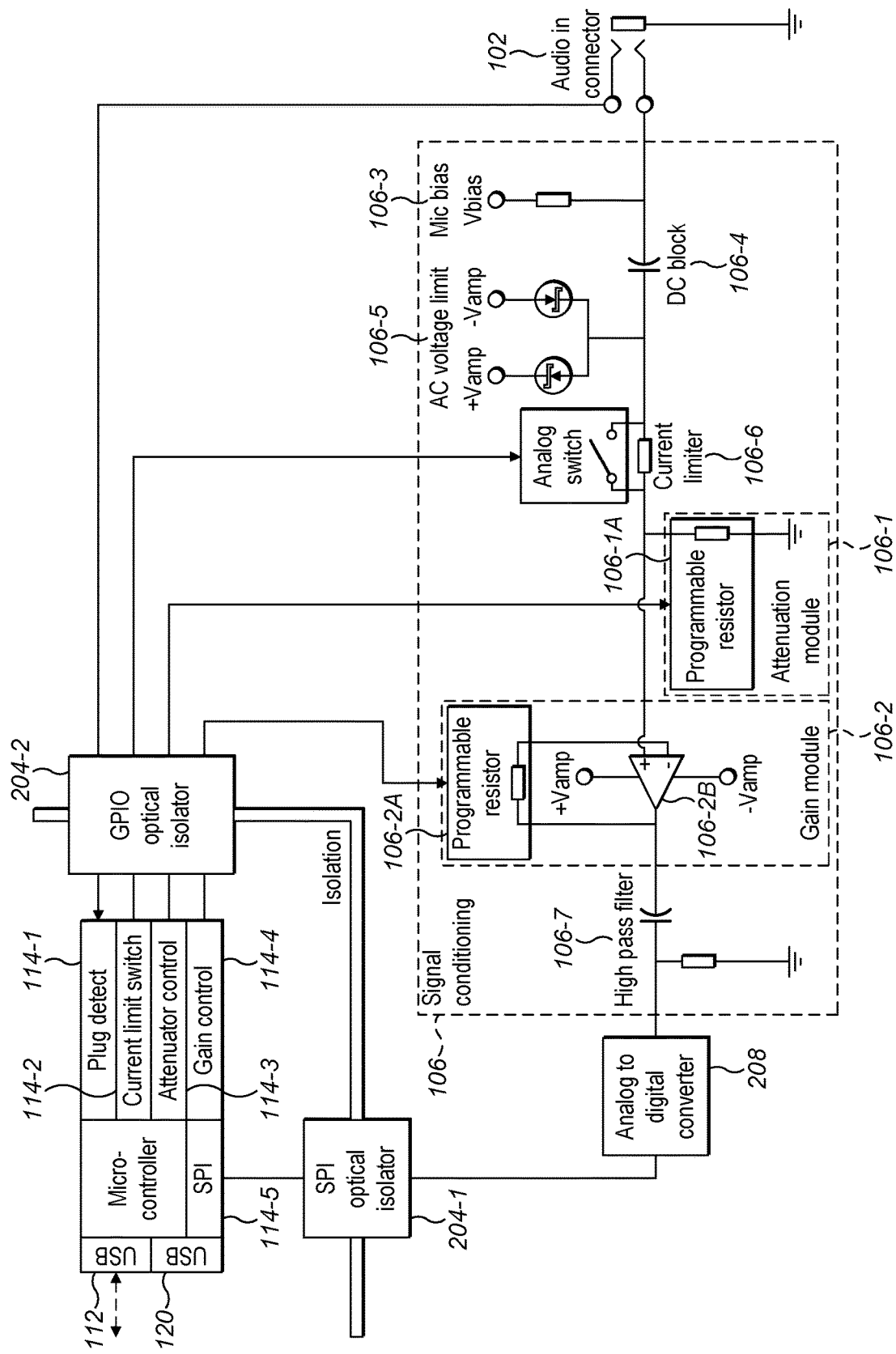
FIG. 2C is an exemplary circuit diagram of the audio interface device of FIGS. 2A and 2B.

FIGS. 1A and 1B correspond to an audio interface device according to a first embodiment, and FIGS. 2A, 2B and 2C correspond to an audio interface device according to a second embodiment.

Both the audio interface devices of the first and second embodiments are configured to be connected to an audio line in a wiretap, or T junction, manner so as to monitor the audio feed on the audio line. This allows for the audio interface device to connect to the analogue audio signal on any commonly available audio system in a way that does not affect the current connection of the audio system.

An exemplary audio line may be a connection from an audio source (such as a microphone, musical instrument, music streaming service, portable music player, smartphone, PC, laptop or the like) to one or more speakers, optionally via an amplifier.

The audio interface device allows the user to monitor an audio signal on the audio line without causing distortion on the existing connected drain device. It is also isolated so that the digital signal is safe and will not cause damage to equipment connected to it. The audio interface device of the first embodiment utilizes magnetic isolation, whilst the audio interface device of the second embodiment utilizes optical isolation.

The audio interface device is configured to receive audio signals over a range of voltages, and to normalize these voltages so that a single audio interface device can be used for audio lines corresponding to a different type of device. For example, an audio signal can have a high VRMS if it is being tapped between an amplifier and a speaker, a very low VRMS if the audio signal is being tapped from a microphone, or a VRMS somewhere in between if the audio signal is tapped from other points in a system. Examples of audio signals into which the audio interface device can tap include can include: a low voltage microphone including providing a bias voltage, a line level voltage for example from 0-10 VRMS, a low voltage speaker connection for example for 2-16Ω speakers, a high voltage speaker (public address system) connection As the VRMS of the signal can be so wide ranging, the audio interface device can apply combinations of programmable gain and attenuation, as well as high pass and low pass filtering, to normalize the audio signal. By normalizing the input VRMS, the audio interface device can receive multiple types of audio input without necessitating different adapters suited to each.

The audio interface device provides a single device that can be added to any audio system so as to tap into and obtain a digital audio feed from an analogue audio signal for monitoring. This provides a one-size-fits-all solution that accepts inputs from a microphone (i.e., a very small input), an input between an audio source and an amplifier (i.e., a small input) or an input between an amplifier and speakers (i.e., a large input). As the audio interface device is arrangeable in this way, it also minimizes disruption to the existing signal, thereby obviating distortion or amplitude changes when fitted to an existing audio system.

FIG. 1A is a conceptual diagram of the audio interface device 10 according to a first embodiment. FIG. 1B is a block diagram of the audio interface device 10 according to the first embodiment, corresponding the conceptual diagram of FIG. 1A, providing further detail on the arrangement and configuration of the components of the audio interface device 10.

Referring to FIG. 1A, an analogue audio signal 100 is extracted from a wiretap in an audio line and fed to an analogue audio input 102. The analogue audio input 102 is a connector that is configured to accept a variety of leads, corresponding to different types of audio line and different points along an audio line, to connect the audio source to the audio interface device 10. The analogue audio input 102 can be connected to a raw audio signal, for example with a range of 0-120 VRMS.

The analogue audio input 102 is shown in more detail in FIG. 1B. As shown in FIG. 1B, the analogue audio input 102 can comprise a low voltage (LV) audio input 102-1 connected to a filter 102-4. The analogue audio input 102 can also comprise a high voltage (HV) audio input 102-2 that is connected to a high voltage protection module 102-3. The high voltage protection module 102-3 is configured to receive the high voltage input from the HV audio input 102-2 and feed it to the filter 102-4. The high voltage protection module 102-3 thus protects the other components of the device from high voltage signals. The high voltage protection module 102-3 can be a potential divider that prevents too much energy being absorbed by the breakdown diodes of the voltage limiter 106-5.

In some examples, the LV audio input 102-1 and the HV audio input 102-2 can be separate inputs/connections. In some examples, if the connector is not insulated, external voltage protection such as a potential divider can be used in the cable to limit the voltage a user can touch. In other examples, a single input/connection can be used for the LV audio input 102-1 and the HV audio input 102-2. An insulated connector can be built into the device, and the switching the LV and HV input can be automated.

In some examples, the LV input can be defined as being <Vamp and the HV input can be defined as being ≥Vamp. Vamp is the power supply of the amplifier 106-2B described subsequently; in some examples Vamp can be +/−15 V.

Returning to FIG. 1A, the raw audio signal from the analogue audio input 102 is then fed to an audio transformer 104. The audio transformer 104 is configured to electrically isolate the raw audio signal by magnetic isolation. The isolated audio signal from the audio transformer 104 is then fed into a signal conditioning module 106. The signal conditioning module is configured to condition the analogue audio signal by normalizing the analogue audio signal to output a normalized or 'conditioned' analogue audio signal. The signal conditioning module 106 is presented in more detail in the block diagram of FIG. 1B. The conditioning/normalizing process is described in more detail subsequently.

In an alternative configuration to FIG. 1A, the audio transformer can be positioned after the signaling condition module 106, such that the raw audio signal is fed into the signal conditioning module from the analogue audio input, and is then electrically isolated following the signal conditioning. The block diagram of FIG. 1B shows this alternative configuration. It will be understood, however, that the audio transformer can be positioned either side of the signal conditioning module in the examples of FIG. 1A and FIG. 1B.

Following the conditioning of the audio signal at the signal conditioning module 106, and isolation at the audio transformer 104, the normalized analogue audio signal is received at a digitizing module 108. The digitizing module 108 is configured to convert the normalized analogue audio signal to a digital audio signal. In some examples, the digitizing module 108 can be an audio digitizer, and in other examples the digitizing module 108 can be a sound card IC. In FIG. 1A the digitizing module 108 is presented as an audio digitizer, whilst in FIG. 1B the digitizing module is presented as a sound card IC (such as a USB sound card, for example an HS100B sound card); however, it is noted that in either example an audio digitizer or a sound card IC can be used.

Optionally, from the digitizing module, the digital audio is received at a digital interface hub 110, such as a USB hub 110 (or a USB 2.0 hub). The hub 110, or concentrator, is configured to combine the multiple digital interfaces in the circuit on a single interface.

The hub 110 provides the digital interface 112 between the audio interface device 10 and an external device such as a personal computer (PC), laptop computer, single-board computer, smartphone, or tablet device. This interface can be provided by a suitable data connector, such as a USB 2.0 or USB-C connection, RS232/485, Firewire, Thunderbolt, Bluetooth or any other interface can also be used. In this way, the digitized and normalized audio signal is received by the external device.

In addition to the interface between the output of the digitizing module 108 and the external device, there can also be an interface between the external device a microcontroller 114 integrated into the audio interface device 10 and connected to the signal conditioning module 106. The microcontroller 114 is configured to control the signal conditioning module 106. The external device can send control communications to the microcontroller 114, and the microcontroller 114 can send control communications to the signal conditioning module 106. In this way, the control of the signal conditioning module 106 can be carried out by a combination of the microcontroller 114 and the external device.

The external device sends a command to the digital interface hub 110. The digital interface hub 110 can be connected to the microcontroller 114 through a USB to serial converter module 116, and through an opto-isolator module 118. The opto-isolator module 118 is configured to isolate the microcontroller 114 and signal conditioning module 114 from the external device. In this way, control communications from the external device are communicated from the external device, via the hub 110, to the microcontroller 114. The microcontroller 114 converts control messages to the required signals needed to control adjustable parts of the signal conditioning.

The hub 110 therefore serves to receive the digitized and normalized signal from the signal conditioning module 106, and send this to the external device, and to receive control communications from the external device and send these to the microcontroller 114. For example, the digitized and normalized signal from the signal conditioning module 106 is received at the USB hub 110 by connection to the USB sound card 108 providing the digitization, and the control communications from the external device are sent from the USB hub 110 to the microcontroller 114 by connection to the USB to serial converter module 116.

In some examples, the hub 110 need to not be included. A single digital output, for the digitized and normalized audio signal, to the external device can instead be provided, for example from the digitizing module. In such an example, the processing and control of the signal conditioning module can be entirely carried out by the microcontroller 114 or an on-device processor, rather than the microcontroller in combination with the external device. That is, the microcontroller alone can carry out the processing and control of the signal conditioning module without connection to or instruction from an external device in such an example.

The manner in which the microcontroller 114 controls the signal conditioning module is described in more detail with reference to FIG. 3 and FIG. 4.

The signal conditioning module has a very high input impedance so as to not cause issues to other connections in the system. The signal conditioning module 106 comprises an attenuation control module 106-1 and a gain control module 106-2. The microcontroller 114 controls the attenuation control module 106-1, using two-way control and feedback communication, to increase/decrease attenuation applied to the raw audio signal; the microcontroller 114 also controls the gain control module 106-2 to increase/decrease the gain applied to the raw audio signal. The signal conditioning module can be further configured to apply high pass and low pass filtering. In this way, the raw audio signal is conditioned or normalized to fall within an acceptable range.

The hub 110 can include a further digital interface to provide separate USB socket 120. This USB socket can be configured to daisy-chain a plurality of audio interface devices together for connection to a single external device. This is described in more detail with reference to FIG. 5.

FIG. 2A is a conceptual diagram of the audio interface device 20 according to the second embodiment. FIG. 2B is a block diagram of the audio interface device according to the second embodiment, corresponding the conceptual diagram of FIG. 2A.

The audio interface device 20 is configured to extract an analogue audio signal 100 from a wiretap in an audio line; the analogue audio signal is fed to an analogue audio input 102 of the audio interface device. The analogue audio input 102 of the audio input device 20, described with reference to FIGS. 2A and 2B comprises the same features as the analogue audio input 102 of the audio input device 10 described with reference to FIGS. 1A and 1B, as such these are not repeated here for conciseness.

The isolated audio signal from the audio transformer 104 is then fed into a signal conditioning module 106. The signal conditioning module is configured to condition the analogue audio signal by normalizing the analogue audio signal to output a normalized or 'conditioned' analogue audio signal. The signal conditioning module 106 is presented in more detail in the block diagram of FIG. 2B and the circuit diagram of FIG. 2C. The conditioning/normalizing process is described in more detail subsequently.

The normalized analogue audio signal is fed from the signal conditioning module 106 to a digitizing module 208, such as an analogue-to-digital converter (ADC). The digitizing module converts the conditioned analogue signal to a digital signal.

The digital signal is then fed to a microcontroller 114. An opto-isolator module 204, for example comprising a digital optical isolator IC, can be positioned between the digitizing module 208 and the microcontroller. The opto-isolator module 204 is configured to isolate the microcontroller 114 from the other components of the audio interface device 20. The opto-isolator provides high voltage isolation between the analogue and digital sides of the device, to provide safety to people and equipment.

The microcontroller 114 serves two main purposes: providing a digital interface with an external device, and controlling the signal conditioning module. The microcontroller 114 is programmed with custom firmware to provide a digital interface to the digital audio feed and to convert control messages to the required signals needed to control adjustable parts of the signal conditioning.

The microcontroller can be a USB microcontroller configured to provide the digital interface by way of a USB plug for two-way communication with an external device such as a personal computer (PC), laptop computer, single-board computer, smartphone, or tablet device. This interface can be provided by a suitable data connector, such as a USB 2.0 or USB-C connection, RS232/485, Firewire, Thunderbolt, Bluetooth or any other interface can also be used. In this way, the digitized and normalized audio signal is received by the external device. In alternative implementations, the microcontroller 114 can be realized as a sound card with firmware suitable for providing gain and attenuation control.

The microcontroller 114 is also connected to the signal conditioning module 106 and configured to control the signal conditioning module 106.

The microcontroller receives control communications from the external device via the digital interface, and the sends control communications to the signal conditioning module 116. In this way, the control of the signal conditioning module 106 can be carried out by a combination of the microcontroller 114 and the external device. Alternatively, the processing and control of the signal conditioning module 106 can be entirely carried out by the microcontroller 114 or an on-device processor, rather than the microcontroller 114 in combination with the external device. That is, the microcontroller alone can carry out the processing and control of the signal conditioning module 106 without connection to or instruction from an external device.

The microcontroller 114 can be isolated from the signal conditioning module using an opto-isolator 204 placed in the communication pathway from the microcontroller to the signal conditioning module. This can be the same opto-isolator 204 as positioned between the digitizing module 208 and the microcontroller 114, or a separate opto-isolator.

The signal conditioning module has a very high input impedance so as to not cause issues to other connections in the system. The signal conditioning module 106 comprises an attenuation control module 106-1 and a gain control module 106-2. The microcontroller 114 controls the attenuation control module 106-1 to increase/decrease attenuation applied to the raw audio signal; the microcontroller 114 also controls the gain control module 106-2 to increase/decrease the gain applied to the raw audio signal. The signal conditioning module can be further configured to apply high pass and low pass filtering. In this way, the raw audio signal is conditioned or normalized to fall within an acceptable range.

The manner in which the microcontroller 114 controls the signal conditioning module is described in more detail with reference to FIG. 3 and FIG. 4.

In some examples, the microcontroller 114 controls the signal conditioning module using a one-way communication. This can use a write only programmable resistor for each channel of control. The microcontroller 114 can store the value it last wrote, and therefore not need to read the values for gain/attenuation applied at the signal conditioning module 106. In such an example, the feedback that the microcontroller receives can be the audio signal itself that is output by the signal conditioning module. In other examples, a two-way communication channel can be implemented between the microcontroller 114 and the signal conditioning module 106 so that the values for gain/attenuation applied at the signal conditioning module 106 can be read back to confirm they have been correctly set.

FIG. 2C presents a more detailed exemplary circuit diagram of the audio interface device 20 of FIGS. 2A and 2B. It is also to be understood that this arrangement can also be applied to the audio interface device 10 of FIGS. 1A and 1B, with appropriate changes made.

The circuit diagram illustrates an exemplary arrangement for the audio input 102, the signal conditioning module 106, the digitizer module 208, the opto-isolator 204, and the microcontroller 114.

The signal conditioning module 106 comprises a mic bias 106-3, a DC block 106-4 providing a low pass filter, an AC voltage limiter 106-5 and a current limiter 106-6 connected with the attenuation module 106-1, gain module 106-2, and a high pass filter 106-7. The attenuation module 106-1 comprises a first programmable resistor 106-1A, connected to ground, and controlled by the microcontroller 114. The gain module 106-2 comprises an operational amplifier 106-2B with a second programmable resistor 106-2A connected between the inverting input and the output; the second programmable resistor 106-2A is connected to the microcontroller 114. The output of the signal conditioning module is connected to the digitizer module 208 (such as an analogue-to-digital converter).

The microcontroller 114 comprises a plurality of general purpose input/output (GPIO) pins 114-1, 114-2, 114-3, 114-4 operably connected to elements of the circuit. The microcontroller 114 can comprise a plug detection pin 114-1 connected to the audio input 102; this is configured to detect when an input is connected to the audio interface device 20. A current limit switch pin 114-2 is connected to the current limiter 106-6, so as to engage the current limiter 106 when necessary. An attenuator control pin 114-3 is connected to the first programmable resistor 106-1A of the attenuation module 106-1 so that the attenuation level can be adjusted under instruction from the microcontroller 114. A gain control pin 114-4 is connected to the second programmable resistor 106-2A of the gain module 106-2 so that the gain level can be adjusted under instruction from the microcontroller 114.

The opto-isolator 204 is split into two components in the circuit diagram of FIG. 3C. A first opto-isolator 204-1 is arranged between the digitizer module 208 (which is itself connected to the output of the signal condition module) and the microcontroller 114. The first opto-isolator can be connected to an SPI interface 114-5 of the microcontroller to act as an SPI optical isolator. The second opto-isolator 204-2 is connected between each of the plug detection pin 114-1 of the microcontroller 114 and the audio input 102, the current limit switch pin 114-2 of the microcontroller 114 and the current limiter 106-6, the attenuation control pin 114-3 of the microcontroller 114 and the attenuation module 106-1, and the gain control pin 114-4 of the microcontroller 114 and the gain control module 106-2. In this way, the second opto-isolator 204-2 acts as a GPIO optical isolator for the GPIO pins 114-1, 114-2, 114-3, 114-4 of the microcontroller 114. As such, the microcontroller 114 is isolated from the other components of the audio interface device 20 by the first 204-1 and second 204-2 optical isolators.

The microcontroller 114 comprises a first USB connector 112, which provides the digital interface to the external device. The microcontroller 114 can also comprise a second USB connector 120 configured for daisy-chaining a plurality of audio interface devices 10, 20 together (as described in more detail with reference to FIG. 5.

It will be understood that elements of the audio interface device 10 of the first embodiment and elements of the audio interface device 20 of the second embodiment are interchangeable. For example, the audio digitizer 108 of the first embodiment 10 can be substituted for the ADC 208 of the second embodiment 20 (and vice versa), and the USB hub 110, USB to serial converter module 116, opto-isolator 118 and microcontroller 114 of the first embodiment 10 can be substituted for the microcontroller 114 and opto-isolator 204 of the second embodiment 20 (and vice versa).

The external device connectable to the audio interface device 10, 20 of FIGS. 1 and 2 can receive the digitized and normalized audio signal (i.e., an output sound stream) from the audio interface device. This sound stream can then be monitored for various purposes such as music identification, speech identification, security monitoring, professional sound recording, input to a mixing desk, integration to AV equipment, and any other suitable purposes for a sound input.

Figure 3:
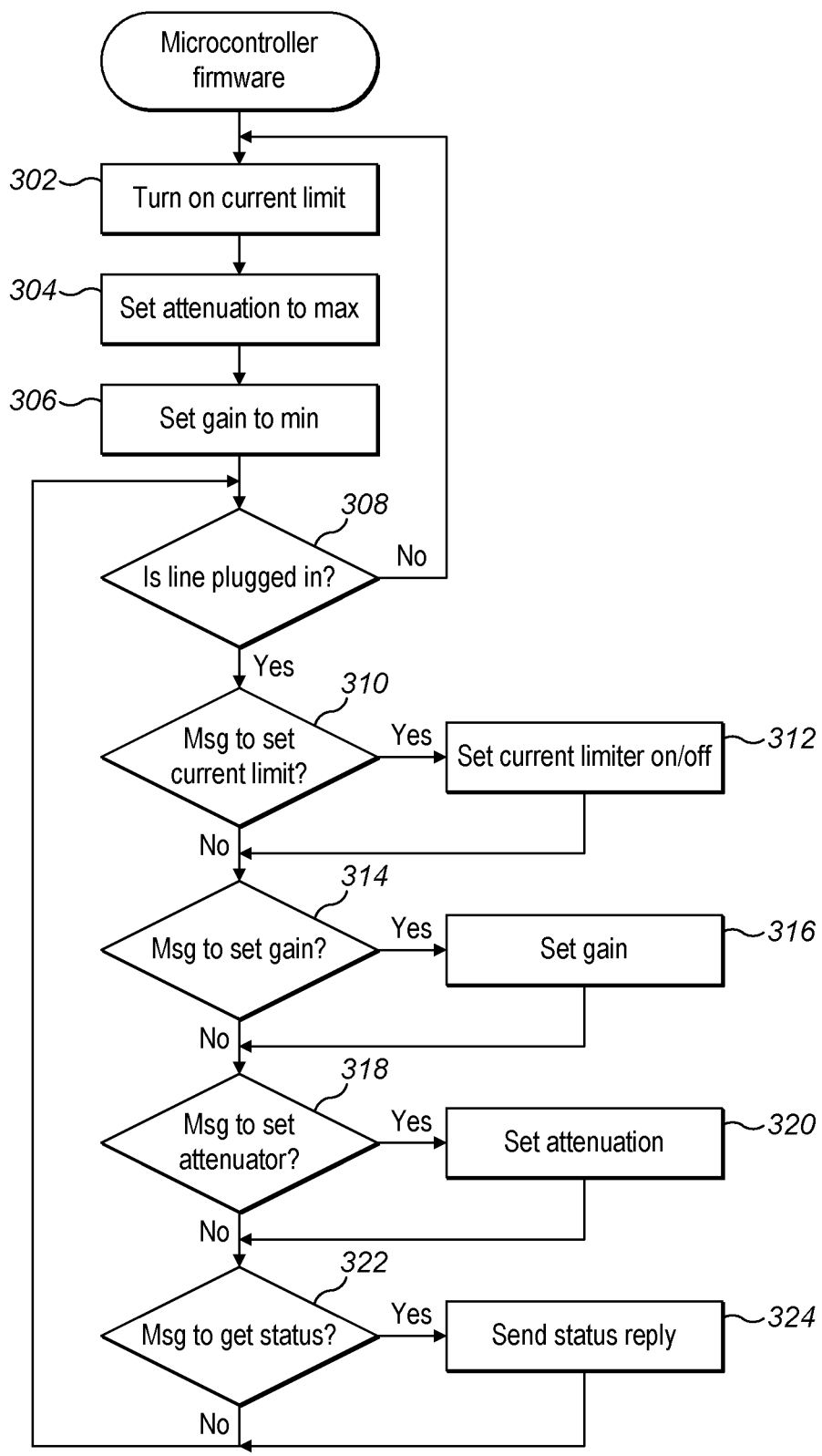
FIG. 3 is an exemplary flow diagram of microcontroller firmware operative steps executed by the audio interface device.
Figure 4:
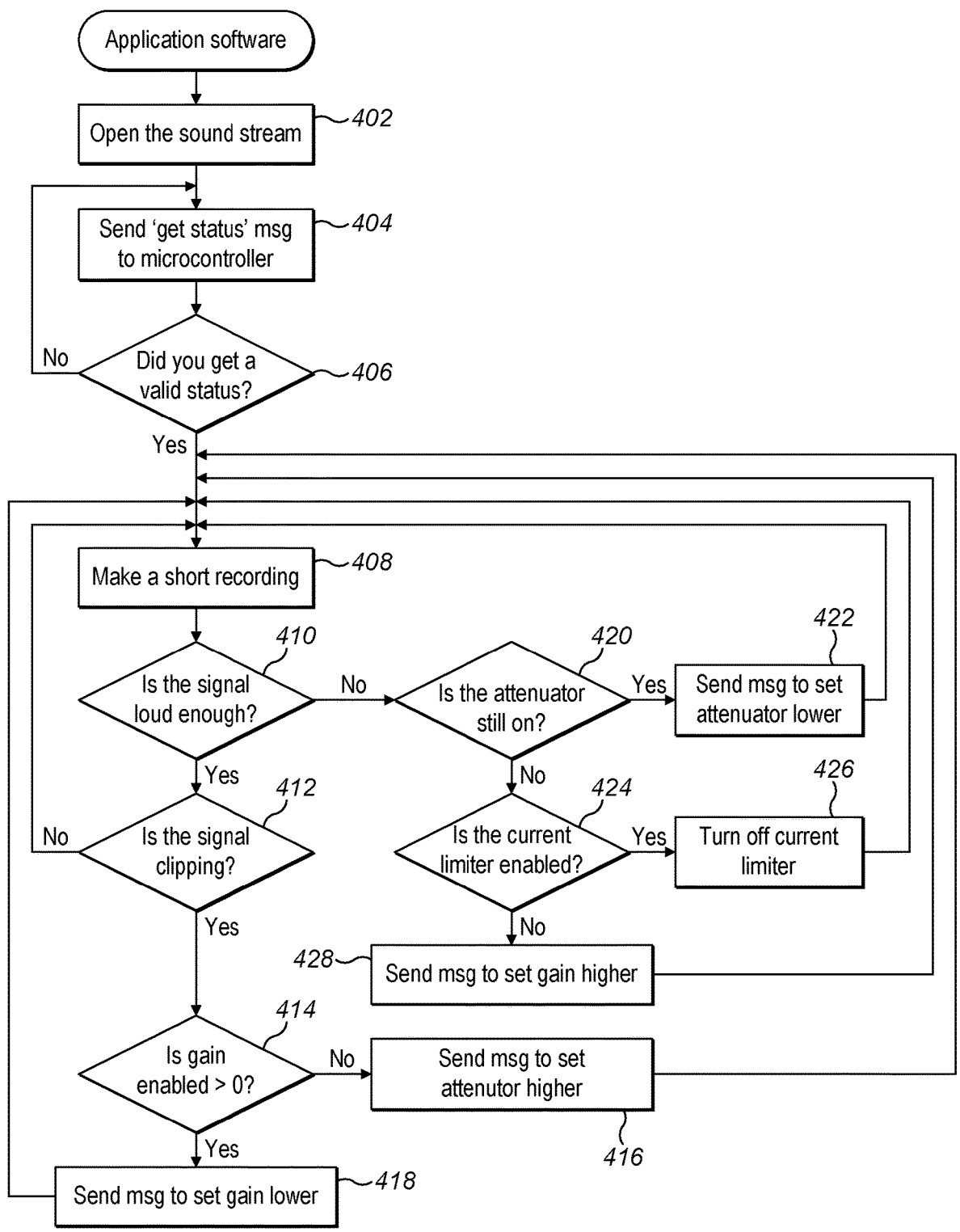
FIG. 4 is an exemplary flow diagram of software operative steps executed by the audio interface device.

FIG. 3 presents an exemplary flow diagram of microcontroller firmware operative steps executed by the audio interface device described with reference to FIGS. 1 and 2, and FIG. 4 presents an exemplary flow diagram of software operative steps executed by the audio interface device described with reference to FIGS. 1 and 2. The processes of FIG. 3 and FIG. 4 combine to provide the overall operational control of the signal conditioning module. FIG. 3 provides the firmware processing steps performed by the microcontroller 114, 214 integrated into the audio interface device 10, 20. FIG. 4 provides the application software processing steps. In the example of FIG. 4, these steps are described as being performed by the external device connected to the audio interface device 10, 20 and sent the microcontroller 114. 214 as control communications, for consistency with the embodiments of FIGS. 1 and 2. However, it will also be understood that in other examples the microcontroller 114, 214 or on-board processor, can instead perform these steps itself without the need for external control communication from the external device. That is, the process of FIG. 4 can instead be carried out by the microcontroller 114, sound card, or an on-board processor rather than an external device.

FIG. 3 details the microcontroller firmware steps, executed by the microcontroller to control the signal conditioning module. Whilst the following steps are described with reference to a microcontroller, it will be readily understood that these can alternatively be carried out by a sound card integrated into the audio interface device, or any on-device processor coupled to a non-transitory medium storing the firmware instructions. The process begins with step 302 wherein the microcontroller switches on the current limiter. At step 304 the microcontroller sets the attenuation to a maximum at the attenuation module, and a step 306 sets the gain to a minimum at the gain module.

Steps 302, 304 and 306 allow the microcontroller to default to a safe mode on start-up, by switching on the current limiter, maximizing the attenuation and minimizing the gain. The attenuation is then incrementally reduced and the gain is incrementally increased, as subsequently described with reference to steps 310, 314 and 318 and FIG. 4. Device start-up can be, for example, when the device is switched on/powered on, or after any reset of the device such as when powering on after a brown out (or loss of power), a soft reset, or a hard reset.

Following the stat-up of steps 302, 304 and 306, at step 308 the microcontroller is configured to determine if a line has been plugged in, i.e., if an audio source has been connected, to the audio input. If a line has not been connected, the process returns to step 302 and the loop of steps 302, 304 and 306 are repeated until it is detected that a line has been plugged in.

When it is detected that a line has been plugged in at step 308, the process continues to a number of steps (310, 314, 318, 322) in which it checks for messages from the application software. These messages from the application software are explained in more detail subsequently, with reference to FIG. 5.

At step 310 the microcontroller checks if a message has been received to set the current limiter to an 'on' or 'off' state. If a message has been received to set the current limiter to an 'on' state, the process continues to step 312 at which the microcontroller switches the current limiter on, and then progresses to step 314. If a message has been received to set the current limiter to an 'off' state, the process continues to step 312 at which the microcontroller switches the current limiter off, and then progresses to step 314. If no message regarding setting the current limiter has been received, the process continues directly to step 314 without setting the current limiter.

At step 314 the microcontroller checks if a message has been received to set the gain at the gain module. If a message has been received to set the gain, the process continues to step 316 at which the gain is set at the instructed level, and the process then continues to step 318. If no message regarding setting the gain has been received, the process continues directly to step 318 with setting the gain.

At step 318 the microcontroller checks if a message has been received to set the attenuation at the attenuation module. If a message has been received to set the attenuation, the process continues to step 320 at which the attenuation is set at the instructed level, and the process then continues to step 322. If no message regarding setting the attenuation has been received, the process continues directly to step 322 without setting the attenuation.

The gain setting message at step 314, and the attenuation setting message at step 318 can indicate specific levels to which the gain and attenuation should respectively be set at steps 316 and 318. Alternatively, the gain setting message and the attenuation setting message can instruct the microcontroller to increase/decrease the gain and attenuation by fixed predetermined amounts respectively at steps 316 and 318. In this way, the gain and attenuation can be gradually adjusted until the signal has been adjusted to within a desired range. These predetermined amounts can be stored in memory associated with the microcontroller.

At step 322 the microcontroller checks if a message has been received to send the device status to the application software. If a message has been received requesting the microcontroller to send a status reply, detailing the device status, the process continues to step 324 at which the microcontroller sends the device status reply to the application software and then loops back to step 308. If a message has not been received requesting the microcontroller to send a status reply, the process loops directly back to step 308 without sending a device status reply. The status reply, or device status message, can be of the order of a few bytes of data and can comprise the current gain value at the gain module 106-2, the current attenuation value at the attenuation module 106-1, if a plug is detected at the input 102, if the current limiter is enabled 106-6, and/or the firmware version running on the microcontroller 114.

Following step 322 (or step 324 if it occurred) the process loops back to step 308 to check if the line is still plugged in. If the line is plugged in, the process repeats the message check steps 314, 318 and 322. If the line is not plugged in, the process loops to step 302 and again turns the current limit on, sets the attenuation to the maximum at step 304, and sets the gain to the minimum at step 306, before again checking if the line is now plugged in.

Referring now to FIG. 4, the application software steps are described. In the examples of FIGS. 1 and 2, the application software steps are performed by the external device connected to the audio interface device by the digital interface. That is, the application software is installed on the external device. In other examples, these steps can instead be performed 'on-device' at the audio interface device rather than by the external device. When performed on-device, the application software steps can be performed by the same microcontroller that performs the firmware steps of FIG. 3, a separate microcontroller, an on-board processor with instructions stored in an associated non-transitory medium, or by any other suitable means. That is, in the alternative, the application software can be installed on the audio interface device.

At step 402, the sound stream is opened. In an example in which the application software is running on an external device, the sound stream can be the digitized output of the signal processing module 106 received at the external device over the digital interface 112. In an example in which the application software is running 'on-device' at the audio interface device 10, 20, the sound stream can be the digitized output from the signal conditioning module 106 received at the microcontroller or on-board processor that performs the application software steps.

The process then continues to step 404 at which the application software sends a 'Get Status' message to the microcontroller executing the firmware steps (FIG. 3). This corresponds to step 322 wherein the microcontroller executing the firmware steps checks if a 'Get Status' message has been received.

Following sending the 'Get Status' message at step 404, the application software checks if a valid status has been received from the firmware (i.e., the status reply sent at step 324). When a valid status has not been received the process loops back to step 404 and another 'Get Status' message is sent to the microcontroller executing the firmware steps. When a valid status has been received, the process continues to step 408. A valid status can be a status reply that can be parsed by the application software to confirm that the microcontroller 114 is running. An invalid status can be considered as the absence of a status reply, or a status reply that cannot be parsed.

At step 408 the application software makes a short recording, or sample, of the sound stream as output by the signal conditioning module to provide a sample of the audio signal. In an example, a short recording can be in the range of 1 to 5 seconds. In some examples the short recording, or sample, is stored in memory associated with the application software. In other examples the short recording is a sample that is processed 'live' i.e., it is not saved in memory.

At step 410 it determined whether the sample of the audio signal is loud enough, thereby indicating if the sound stream itself is loud enough (i.e., whether the amplitude of the RMS voltage of the signal is high enough to provide a signal of sufficient audio quality). That is, the audio interface system determines when an amplitude of the audio signal meets a minimum amplitude requirement. If the audio signal does not meet the minimum amplitude requirement the signal conditioning module is configured to adjust the amplitude of the audio signal to output the normalized audio signal having an amplitude that meets the minimum amplitude requirement.

Determining whether the signal is loud enough comprises comparing the amplitude of the signal against a first threshold. If the signal is above the first threshold, the signal is loud enough, and the process continues to step 412. If the signal is not above the first threshold (i.e., the signal does not meet the minimum amplitude requirement), the signal is not loud enough, and the process continues to step 420. The first threshold can be predetermined and stored in storage associated with the application software. A first example of the first threshold can be a minimum allowable peak amplitude value of the signal in the short recording. A second example of the first threshold can be a minimum allowable RMS (root mean square) value of the signal in the short recording.

At step 420 a check is made as to whether the attenuator is (still) on. If the attenuator is on, the application software proceeds to step 422 and sends a message to the firmware microcontroller instructing it to set the attenuator to lower the attenuation level (i.e., to decrease the attenuation). This corresponds to the microcontroller firmware checking for the message to set the attenuator at step 318. The process then returns to step 408 and another short recording of the output of the signal conditioning module is made to provide a further sample of the audio signal with the updated attenuation level, and it is again determined if the signal is loud enough at step 410. If the signal is still not loud enough (step 410), and the attenuator is still on (step 420), another message is sent to lower the attenuation level (step 422). This loop continues until either the signal is loud enough (step 410) or the attenuator is no longer on (step 420).

If the attenuator is not on, the process continues to step 424 and it is determined if the current limiter is enabled. If the current limiter is enabled, the process continues to step 426 and a message is sent to the firmware microcontroller instructing it to turn off the current limiter. This corresponds to the microcontroller firmware checking for the message to set the current limiter at step 310. The process then returns to step 408 and another short recording is made, and it is again determined if the signal is loud enough at step 410. If the signal is still not loud enough (step 410), the attenuator is off (step 420) and the current limiter is not enabled (step 424), the process proceeds to step 428.

At step 428, a message is sent to the microcontroller firmware instructing it to increase the gain level (i.e., to set the gain higher). This corresponds to the microcontroller firmware checking for the message to set the gain at step 314. The process then returns to step 408 and another short recording of the output of the signal conditioning module is made to provide a further sample of the audio signal with the updated gain level, and it is again determined if the signal is loud enough at step 410, the process continues to loop through steps 420 to 424 and 428, 408 and 410, increasing the gain each time, until the signal is loud enough.

Returning to step 410, when it is determined that the signal is loud enough, i.e. If the signal is above the first threshold, the process continues to step 412.

At step S412, it is determined whether the sample of the audio signal is too loud, thereby indicating if the sound stream itself too loud (i.e., whether the amplitude of the RMS voltage of the signal is too high to provide a signal of sufficient audio quality). That is, the audio interface system determines when an amplitude of the audio signal exceeds a maximum amplitude requirement. If the audio signal exceeds the maximum amplitude requirement the signal conditioning module is configured to adjust the amplitude of the audio signal to output the normalized audio signal having an amplitude that meets the maximum amplitude requirement.

In other words, the normalized audio signal has an amplitude that meets the minimum amplitude requirement and does not exceed the maximum amplitude requirement.

If elements of the signal have an amplitude above a second threshold (i.e., the signal exceeds the maximum amplitude requirement), causing the signal to clip, it is determined to be too loud and the process continues to step 414. The second threshold can be predetermined and stored in storage associated with the application software. In an example, the second threshold can be defined as a maximum amplitude level at or above which the audio clips. In some examples the second threshold is met when a single peak in the signal in the short recording clips; in other examples the second threshold can be met when a predetermined number (greater than one) of peaks in the signal in the short recording clip.

In an example, the peak audio signal is maintained at approximately 80% of the maximum signal range by controlling the gain and attenuation at the gain module 106-2 and the attenuation module 106-1. This then allows for occasional peaks in the 80-99% range, without distortion. The signal clips when it hits 100%, meeting the second threshold, causing the process to continue to step 414.

At step 414, it is determined whether the gain module is enabled (i.e., whether the gain is greater than 0).

If the gain module is not enabled, the process continues to step 416 and a message is sent to the microcontroller firmware instructing that the attenuation level is increased (i.e. that the attenuator module is set higher). This corresponds to the microcontroller firmware checking for the message to set the attenuator at step 318. The process then loops back to step 408 and another short recording of the sound stream as output by the signal conditioning module is made to provide a sample of the audio signal with the increased attenuation applied, and the process from step 410 repeats.

If the gain module is enabled, the process continues to step 418 and a message is sent to the microcontroller firmware instructing that the gain level is decreased (i.e., that the gain module is set lower). This corresponds to the microcontroller firmware checking for the message to set the gain at step 314. The process then loops back to step 408 and another short recording of the sound stream as output by the signal conditioning module is made to provide a sample of the audio signal with the decreased gain applied, and the process from step 410 repeats.

At step 412, if the signal is not clipping, the signal is not determined to be too loud and the process loops back to step 408 and another short recording of the sound stream as output by the signal conditioning module is made to provide a sample of the audio signal. The process then continues to loop through the steps 408 onwards for the duration of the sound stream being monitored by the external device.

The operational steps described with reference to FIGS. 3 and 4 allow for the microcontroller to incrementally increase the gain and decrease attenuation at the signal conditioning module, from the safe mode with maximum attenuation and minimum gain, to bring the signal to within a desired range. This is beneficial in a 'new' system (i.e., when a new audio source is connected to the audio interface device) as the RMS voltage, or peak amplitude, of the raw audio signal is not known. In an 'existing' system (i.e., when an existing audio source is connected to the audio interface device) the gain and attenuation can be set directly to previously determined levels for the audio source. In an example, a system can be considered as 'existing' when a change to the plug status at the input 102 has not been detected, or when a serial number of the audio interface device has not changed. Following running the setup steps (e.g., steps 302-306), the system assumes that the audio setup is the same (i.e., an 'existing' system).

The operational steps described with reference to FIGS. 3 and 4 provide for the sound stream output of the audio interface device, received over the digital interface at the external device, to be continually adjusted using the signal conditioning module, ensuring that the amplitude of the sound stream output is conditioned or normalized to be within a desired range, thereby providing a high quality audio input stream into the external device. In more general terms, the desired amplitude range for a normalized signal can be defined as being between the first (lower) threshold at which the signal is sufficiently loud, and the second (upper) threshold at which the signal is clipping.

The processing steps described with reference to the microcontroller firmware of FIG. 3 may be carried out as part of the process of the application software steps of FIG. 4, processing steps described with reference to the application software of FIG. 4 may be carried out as part of the process of the microcontroller firmware steps of FIG. 3, the processing steps described with reference to FIGS. 3 and 4 may be carried out as one process on one device of the system, or any of the processing steps described with reference to FIGS. 3 and 4 may be carried out by any appropriate device in the system. That is, the processing steps described with reference to FIG. 3 need not all be carried out on one device, and the processing steps described with reference to FIG. 4 need not all be carried out on one (other) device. A device in the system may perform some, but not all, of the processing steps described with reference to both FIGS. 3 and 4, and another device (or other devices) in the system may perform other processing steps described with reference to both FIGS. 3 and 4.

Figure 5:
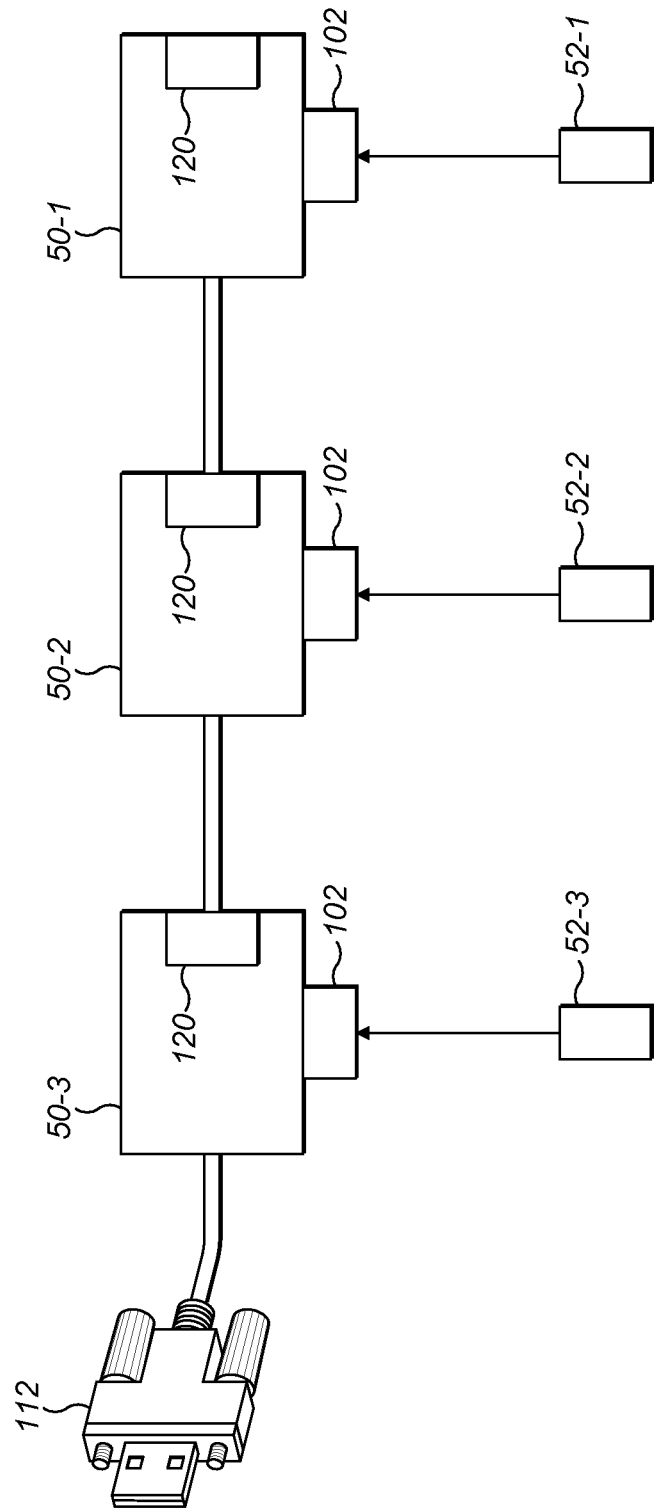
FIG. 5 is a block diagram of daisy-chained audio interface devices.

In some examples, a plurality of audio interface devices 10, 20 can be daisy-chained together. FIG. 5 shows an example of three audio interface devices daisy-chained together. A first audio interface device 50-1, is connected to a first audio line 52-1, for example by a first wiretap. A second audio interface device 50-2, is connected to a second audio line 52-2, for example by a second wiretap. A third audio interface device 50-3, is connected to a third audio line 52-3, for example by third a wiretap. The digital interface output 112 (e.g., a USB plug) of the first audio interface device 50-1 is connected to the daisy chain port 120 (e.g., a USB socket or data port) of the second audio interface device 50-2. The digital interface output 112 of the second audio interface device 50-2 is connected to the daisy chain port 120 of the third audio interface device 50-3. The digital interface output 112 of the third audio interface 50-3 is connected to the external device. In this way, the output of the first audio interface device 50-1 can be carried to the external device via the second audio interface device 50-2 and the third audio interface device 50-3, and the output of the second audio interface device 50-2 can be carried to the external device via the third audio interface device 50-3. This allows for the external device to monitor multiple audio lines (and perform the steps of FIG. 4 in the example in which the application software is installed on the external device) whilst only using one data port (e.g., a USB port) rather than occupying a data port for each audio interface device. Whilst FIG. 5 is described with reference to three audio interfaces, it will be understood that any suitable number of audio interfaces can be daisy-chained in the manner described.

Figure 6A:
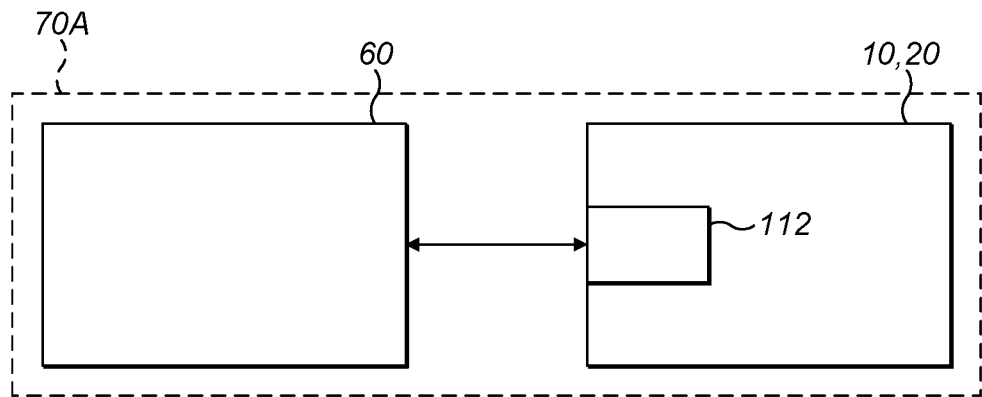
FIG. 6A is a block diagram of a first audio interface system.

FIG. 6A presents a block diagram of an exemplary audio interface system 70A, comprising the audio interface device 10, 20 and an external device 60. The audio interface device 10, 20 and the external device 60 are connected by way of the digital interface 112. In this example, the external device 60 is configured to receive the conditioned output signal of the audio interface device 10, 20, as well as performing the application software steps described with reference to FIG. 4.

Figure 6B:
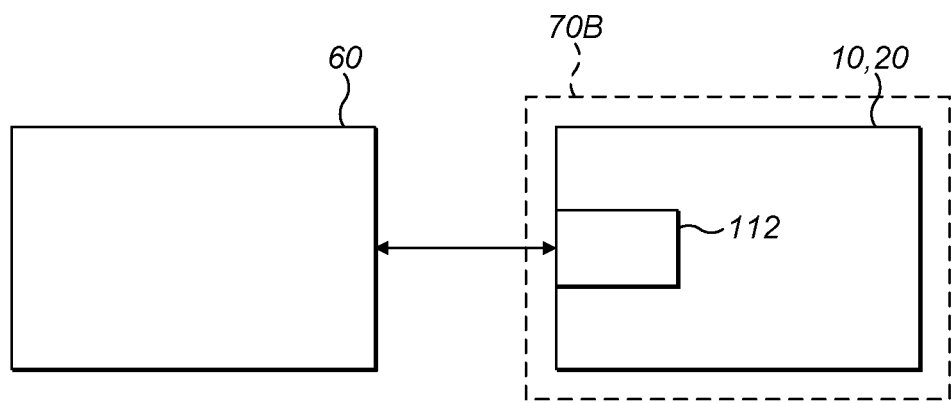
FIG. 6B is a block diagram of a second audio interface system.

FIG. 6B presents a block diagram of an alternative exemplary audio interface system 70B in which the application software steps of FIG. 4 are performed 'on-device' at the audio interface device 10, 20. In this example, the audio interface system 70B comprises the audio interface device 10, 20. The external device 60 is configured to receive the conditioned output signal of the audio interface device 10, 20. The audio interface device 10, 20 and the external device 60 are connected by way of the digital interface 112.

Whilst the foregoing description described the audio interface device and external device as separate devices, it will be understood that in some examples, the external device and audio interface device can be components of a single overall device. That is, a single overall device, configured to monitor an audio line, can include the external device (e.g., a single board computer or the like) and the audio interface device.

The microcontroller(s) 114, or sound card, referred to in the preceding examples, that can be configured to perform the microcontroller firmware steps of FIG. 3 (and the application software steps of FIG. 4, when these steps are performed 'on-device'), can more generally be considered as one or more control units or controllers, of a suitable type, integrated into the audio interface device; said controller(s) or control unit(s) can be considered a controller of the audio interface system. Furthermore, a CPU of the external device, that can be configured to perform the application software steps described with reference to FIG. 4, can also be considered a controller in the audio interface system.

The processing steps described herein may be stored in a non-transitory computer-readable medium. A computer-readable medium can include non-volatile media and volatile media. Volatile media can include semiconductor memories and dynamic memories, amongst others. Non-volatile media can include optical disks and magnetic disks, amongst others.

It will be readily understood to the skilled person that the preceding embodiments in the foregoing description are not limiting; features of each embodiment may be incorporated into the other embodiments as appropriate. In particular, features described with reference to FIGS. 1A, 1B, 2A, 2B and 2C may be introduced to one another without departing from the scope of the disclosure. Likewise, the processing steps described with reference to FIGS. 3 and 4 may be carried out as part of either process, as appropriate, and in some examples the processing steps described with reference to FIGS. 3 and 4 can be configured as a single process flow.

What is claimed is:

1. An audio interface system configured to receive an audio signal from an audio line and output a normalized audio signal, wherein the audio interface system comprises an audio interface device comprising:
    a signal conditioning module comprising a gain module configured to apply a gain to the audio signal and an attenuation module configured to apply an attenuation to the audio signal to output the normalized audio signal; and
    an interface configured to communicate the normalized audio signal with an external device;
    wherein, in response to the audio interface system determining that an amplitude of the audio signal does not meet a minimum amplitude requirement or exceeds a maximum amplitude requirement, the signal conditioning module is configured to adjust the amplitude of the audio signal by applying the gain and attenuation to output the normalized audio signal having an amplitude that meets the minimum amplitude requirement and does not exceed the maximum amplitude requirement;
    wherein the signal conditioning module is configured to reduce the attenuation applied by the attenuation module and increase the gain applied by the gain module when a sample of the audio signal does not meet the minimum amplitude requirement by:
        reducing the attenuation applied by the attenuation module repeatedly by predetermined amounts until a further sample of the audio signal meets the minimum amplitude requirement, or until the attenuation is reduced to a minimum; and
        increasing the gain applied by the gain module repeatedly by predetermined amounts until a further sample of the audio signal meets the minimum amplitude requirement, wherein the signal conditioning module is configured to only increase the gain applied by the gain module when the attenuation applied by the attenuation module is at a minimum and a sample of the audio signal does not meet the minimum amplitude requirement; and
    wherein the signal conditioning module is configured to decrease the gain applied by the gain module and increase the attenuation applied by the attenuation module when a sample of the audio signal exceeds the maximum amplitude requirement by:
        decreasing the gain applied by the gain module repeatedly by predetermined amounts until a further sample of the audio signal does not exceed the maximum amplitude requirement, or until the gain is decreased to a minimum; and
        increasing the attenuation applied by the attenuation module repeatedly by predetermined amounts until a further sample of the audio signal does not exceed the maximum amplitude requirement, wherein the signal conditioning module is configured to only increase the attenuation applied by the attenuation module when the gain applied by the gain module is at a minimum and a sample of the audio signal exceeds the maximum amplitude requirement.

2. The audio interface system of claim 1, wherein the signal conditioning module is configured to turn off a current limiter when the sample of the audio signal does not meet the minimum amplitude requirement.

3. The audio interface system of claim 1, wherein the audio interface system is configured to determine that the amplitude does not meet the minimum amplitude requirement when the amplitude of the audio signal in the sample is below a first threshold.

4. The audio interface system of claim 1, wherein the audio interface system is configured to determine that the amplitude exceeds the maximum amplitude requirement when the amplitude of the audio signal in the sample meets or exceeds a second threshold.

5. The audio interface system of claim 1, wherein the signal conditioning module is configured to enter a safe setting upon a powering on or resetting of the audio interface device, wherein in the safe setting the signal conditioning module is configured to set the attenuation applied by the attenuation module to a maximum and setting the gain applied by the gain module to a minimum.

6. The audio interface system of claim 1, wherein the audio interface device comprises a digitizing module configured to convert the normalized audio signal to a digital audio signal.

7. The audio interface system of claim 6, wherein the audio interface device comprises a digital optical isolator configured to receive the digital audio signal from the digitizing module and to isolate the digital audio signal to provide an isolation between an analogue side of the audio interface device and a digital side of the audio interface device.

8. The audio interface system of claim 1, wherein the audio interface device comprises an audio transformer configured to electrically isolate the audio signal or the normalized audio signal.

9. The audio interface system of claim 1, wherein the audio interface device is configured to receive the audio signal from a wiretap in the audio line.

10. The audio interface system of claim 1, wherein the audio interface device comprises a data port configured to connect to a digital interface of a second audio interface device to daisy-chain the audio interface device and the second audio interface device.

11. The audio interface system of claim 10, comprising a plurality of audio interface devices daisy-chained by their respective data ports.

12. The audio interface system of any claim 1, wherein the audio interface system further comprises the external device.

13. An audio signal normalization method, comprising:
    receiving, at an audio interface system comprising an audio interface device, an audio signal from an audio line;
    determining that an amplitude of the audio signal does not meet a minimum amplitude requirement or exceeds a maximum amplitude requirement;
    normalizing, by a signal conditioning module of the audio interface device, the audio signal by adjusting the amplitude of the audio signal by applying gain to the audio signal by a gain module of the signal conditioning module, and/or by applying attenuation to the audio signal by an attenuation module of the signal conditioning module, to output a normalized audio signal having an amplitude that meets the minimum amplitude requirement and does not exceed the maximum amplitude requirement; and
    communicating, by an interface of the audio interface device, the normalized audio signal with an external device;
    wherein normalizing the audio signal comprises:
        reducing the attenuation applied by the attenuation module and increasing the gain applied by the gain module when a sample of the audio signal does not meet the minimum amplitude requirement by:
            reducing the attenuation applied by the attenuation module repeatedly by predetermined amounts until a further sample of the audio signal meets the minimum amplitude requirement, or until the attenuation is reduced to a minimum; and
            increasing the gain applied by the gain module repeatedly by predetermined amounts until a further sample of the audio signal meets the minimum amplitude requirement, wherein the signal conditioning module is configured to only increase the gain applied by the gain module when the attenuation applied by the attenuation module is at a minimum and a sample of the audio signal does not meet the minimum amplitude requirement; and
        decreasing the gain applied by the gain module and increasing the attenuation applied by the attenuation module when a sample of the audio signal exceeds the maximum amplitude requirement by:
            decreasing the gain applied by the gain module repeatedly by predetermined amounts until a further sample of the audio signal does not exceed the maximum amplitude requirement, or until the gain is decreased to a minimum; and
            increasing the attenuation applied by the attenuation module repeatedly by predetermined amounts until a further sample of the audio signal does not exceed the maximum amplitude requirement, wherein the signal conditioning module is configured to only increase the attenuation applied by the attenuation module when the gain applied by the gain module is at a minimum and a sample of the audio signal exceeds the maximum amplitude requirement.

14. The audio signal normalization method of claim 13, wherein determining that the amplitude does not meet the minimum amplitude requirement comprises determining that the amplitude of the audio signal in a sample of the audio signal is below a first threshold.

15. The audio signal normalization method of claim 13, wherein determining that the amplitude exceeds the maximum amplitude requirement comprises determining that the amplitude of the audio signal in a sample of the audio signal meets or exceeds a second threshold.

16. The audio signal normalization method of claim 13, wherein normalizing the audio signal comprises turning off a current limiter of the signal conditioning module.

17. The audio signal normalization method of claim 13 further comprising:
    entering a safe setting in response to determining that the audio interface device has been powered on or reset, wherein entering the safe setting comprises setting the attenuation applied by the attenuation module to a maximum and setting the gain applied by the gain module to a minimum.

18. One or more non-transitory computer-readable media storing instructions that, when executed by one or more processors in an audio interface system, cause the one or more processors to perform the audio signal normalization method of claim 13.

* * * * *